United States Patent
Yamada et al.

(10) Patent No.: US 8,614,399 B2
(45) Date of Patent: Dec. 24, 2013

(54) ELECTRIC JUNCTION BOX

(75) Inventors: Hiroaki Yamada, Shizuoka (JP); Hiroki Shiraiwa, Shizuoka (JP); Katsuyoshi Kobayashi, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 325 days.

(21) Appl. No.: 12/929,403

(22) Filed: Jan. 21, 2011

(65) Prior Publication Data
US 2011/0180318 A1 Jul. 28, 2011

(30) Foreign Application Priority Data
Jan. 28, 2010 (JP) ................................. 2010-017280

(51) Int. Cl.
*H01R 13/502* (2006.01)
*H01R 12/00* (2006.01)
*H02B 1/18* (2006.01)
*H02B 1/04* (2006.01)
*H05K 1/00* (2006.01)

(52) U.S. Cl.
USPC ........... 174/559; 361/630; 361/631; 361/632; 439/76.1

(58) Field of Classification Search
USPC ........... 174/559, 58, 560, 561; 361/624, 630, 361/631, 632, 652, 730; 439/76.1, 76.2; D13/110, 152
See application file for complete search history.

(56) References Cited

U.S. PATENT DOCUMENTS

| | | | | |
|---|---|---|---|---|
| 4,781,600 A * | 11/1988 | Sugiyama et al. | | 439/45 |
| 4,942,499 A * | 7/1990 | Shibata et al. | | 361/826 |
| 5,718,047 A * | 2/1998 | Nakayama et al. | | 439/724 |
| 6,728,110 B2 * | 4/2004 | Koyama | | 361/752 |
| 6,768,054 B2 * | 7/2004 | Sato et al. | | 174/50 |
| 6,962,499 B2 * | 11/2005 | Yamamoto et al. | | 439/76.2 |
| 6,971,888 B2 * | 12/2005 | Takeuchi et al. | | 439/76.2 |
| 7,269,019 B2 * | 9/2007 | Hirata et al. | | 361/719 |
| 2005/0011658 A1 * | 1/2005 | Oda | | 174/50 |
| 2005/0013095 A1 * | 1/2005 | Oda | | 361/601 |
| 2005/0221643 A1 * | 10/2005 | Tomikawa et al. | | 439/79 |

FOREIGN PATENT DOCUMENTS

| | | |
|---|---|---|
| EP | 2224564 A1 | 9/2010 |
| JP | 2009-153318 A | 7/2009 |

* cited by examiner

*Primary Examiner* — Chau Nguyen
*Assistant Examiner* — Roshn Varghese
(74) *Attorney, Agent, or Firm* — Edwards Wildman Palmer LLP; James E. Armstrong, IV; Carolina E. Save

(57) ABSTRACT

There is provided an electric junction box (1) which can reduce the usage of the heat-resistant resin for a connector fitting portion. The electrical junction box (1) includes a case (4) including a box-like body (3) and a box-like body (2) to be assembled together, a substrate (5) received in the case (4), a connector fitting portion (9) arranged to engage with a connector and having a terminal (6) soldered to the substrate (5) with lead-free solder, a holding portion (19) holding the terminal (6), and a tubular outer wall (8) surrounding the terminal (6). The holding portion (19) and the outer wall (8) are formed as separate parts. The outer wall (8) is divided into two segments formed integrally with the box-like bodies (3, 2), respectively. The holding portion (9) is made of heat-resistant resin while the outer wall (8) is made of non-heat-resistant resin.

15 Claims, 13 Drawing Sheets

ELECTRIC JUNCTION BOX

CROSS REFERENCE TO RELATED APPLICATION

The priority application Japan Patent Application No. 2010-017280 upon which this patent application is based is hereby incorporated by reference.

BACKGROUND OF THE INVENTION

1. Field of the Invention

The present invention relates to an electric junction box to be mounted to an automobile. In particular, the present invention relates to an electric box having a connector fitting portion to which a connector of a wire harness is fitted.

2. Description of the Related Art

A variety of electric equipments are mounted to an automobile. In order to supply electric power to these electric equipments as well as transmit signal thereto, there is provided an electric junction box located at a suitable position in the automobile. The electric junction box herein is used as a general term for a junction block (also referred as a junction box), a fuse block (also referred as a fuse box) or a relay block (also referred as a relay box).

There may be several types of electric junction boxes depending on a type of the automobile. One example of the electric junction box is shown in FIG. 13, in which an electric junction box 310 is provided with a case 304 composed of a box-like body 302 and a box-like body 303 which can be assembled together, a substrate (not shown) received in the case 304, and a connector fitting portion 309 provided at an end portion of the substrate and exposed on the outside of the case 304 (refer to Japanese Patent Application Publication No. 2009-153318).

The connector fitting portion 309 is arranged to engage with a connector of a wire harness. Furthermore, the connector fitting portion 309 is provided with a housing 305 made of synthetic resin and an L-shaped terminal 306 formed at the housing 305 by insert molding, as shown in FIG. 14. The housing 305 includes and is formed integrally with: a back wall 307 holding a middle portion of the terminal 306; and an outer wall 308 surrounding one end portion 306a of the terminal 306. The one end portion 306a of the terminal 306 inside the outer wall 308 is arranged to electrically connect with a connector fitted into the outer wall 308. In addition, the other portion 306b of the terminal 306 arranged outside the outer wall 308 is soldered to the substrate using reflow soldering or flow soldering and is electrically connected to the substrate.

SUMMARY OF THE INVENTION

Problems to be Solved

For the connector fitting portion 309 of the above-described conventional electric junction box 310, the plurality of terminals 306 which is formed integrally with the housing 305 is soldered to the substrate via reflow soldering or flow soldering. Therefore, the synthetic resin material constituting the housing 305 needs to be heat-resistant resin which is resistant to heat of a reflow soldering oven for the reflow soldering or of a soldering tank for the flow soldering. However, since this heat-resistant resin is expensive, there is a problem of increase in cost. Furthermore, since the connector fitting portion 309 of the conventional electric junction box 310 is fixed to the case 304 with a screw, the cost of screws causes further increase in cost.

In view of the above-described problem, an object of the present invention is to provide an electric junction box which can reduce cost by reducing usage of the heat-resistant resin for the connector fitting portion.

Solution to Problems

In order to attain the above objective, the present invention provides, in a first aspect, an electric junction box having: a case including one box-like body and the other box-like body to be assembled together; a substrate received in the case; and a connector fitting portion into which a connector fits, the connector fitting portion having a terminal soldered to the substrate using lead-free solder and electrically connected to the substrate, a holding portion holding the terminal and a tubular outer wall surrounding the terminal. The holding portion and the outer wall are formed as separate parts, and the outer wall is divided into two segments, the two segments being formed integrally with the one box-like body and the other box-like body, respectively. The holding portion is made of heat-resistant resin which is resistant to heat used during the soldering, while the outer wall is made of non-heat-resistant resin which melts due to the heat used during the soldering. The term "soldering" herein is defined as reflow soldering or flow soldering.

In order to attain the above objective, the present invention provides, in a second aspect, the electric junction box described above, in which the holding portion is provided with a projection projecting from at least one of one end portion of the holding portion and the other end portion of the holding portion, and at least one of the one box-like body and the other box-like body is provided with a recessed portion or a through hole into which the projection is inserted, so that the holding portion is attached to the case by press-fitting the projection into the recessed portion or into the through hole, or by inserting the projection into the recessed portion or into the through hole followed by bonding the projection to the recessed portion or to the through hole.

In order to attain the above objective, the present invention provides, in a third aspect, the electric junction box described above, in which one of the two segments of the outer wall is provided with a projection projecting towards the other one of the two segments, while the other one of the two segments is provided with a recessed portion or a through hole, so that the two segments are fixed together by press-fitting the projection of the segment into the recessed portion or the through hole of the segment, or by inserting the projection of the segment into the recessed portion or the through hole of the segment followed by bonding the projection of the segment to the recessed portion or the through hole of the segment.

In order to attain the above objective, the present invention provides, in a fourth aspect, the electric junction box described above, in which the one box-like body is provided with a groove arranged to engage with the one end portion of the holding portion, and the other box-like body is provided with a groove arranged to engage with the other end portion of the holding portion, and the holding portion is attached to the case so as to be sandwiched between the groove of the one box-like body and the groove of the other box-like body.

In order to attain the above objective, the present invention provides, in a fifth aspect, the electric junction box described above, in which the connector fitting portion is provided with a guide for guiding the connector to be fitted into the connector fitting portion, the guide extending perpendicularly from the holding portion in a direction of a side of the connector.

Advantageous Effect of the Invention

According to the first aspect of the present invention, since the electric junction box includes the holding portion and the outer wall formed as separate parts, and the holding portion is made of heat-resistant resin while the outer wall is made of non-heat-resistant resin, the amount of heat-resistant resin used for the connector fitting portion can be reduced, thereby reducing the cost of the electric junction box.

According to the second aspect of the present invention, the holding portion is provided with the projection and the box-like body of the case is provided with the recessed portion or the through hole, and the holding portion is attached to the case by press-fitting the projection into the recessed portion or into the through hole, or by inserting the projection into the recessed portion or into the through hole followed by bonding the projection to the recessed portion or to the through hole. Consequently, there is no need to use a screw for the fixation of the holding portion and the case, further reducing the cost.

According to the third aspect of the present invention, one of the two segments of the outer wall is provided with the projection while the other one of the two segments is provided with the recessed portion or the through hole, so the two segments can be fixed together by press-fitting the projection into the recessed portion or the through hole or by inserting the projection into the recessed portion or the through hole followed by bonding the projection with the recessed portion or the through hole. Consequently, the outer wall can be prevented from opening, and also the accuracy of the size of the opening (inner diameter) of the outer wall can be improved. Thus, the reduction in accuracy of size of the connector fitting portion with respect to the connector which may be caused by forming the holding portion and the outer wall as separate parts and by dividing the outer wall can be prevented.

According to the fourth aspect of the present invention, the holding portion is attached to the case so as to be sandwiched between the grooves of the one and the other box-like bodies. Consequently, there is no need to use a screw for the fixation of the holding portion and the case, further reducing the cost. Furthermore, by engaging the holding portion with the grooves, the holding portion can be easily positioned with respect to the box-like body, so the assembling of the holding portion and the box-like bodies can be facilitated. Furthermore, it is expected that forming the holding portion and the outer wall as separate parts may cause the deformation of the holding portion due to a load applied thereto when fitting or removing the connector, or cause the soldered portion between the substrate and the terminal to be subjected to an external force; however, by fitting the one end portion and the other end portion of the holding portion into the grooves, the deformation of the holding portion can be reduced, as well as the application of the external force to the soldered portion can be prevented.

According to the fifth aspect of the present invention, the connector fitting portion is provided with the guide for guiding the connector to be fitted into the connector fitting portion, the guide extending perpendicularly from the holding portion in a direction of a side of the connector. Consequently, the positioning of the terminal of the connector with respect to the terminal of the connector fitting portion can be achieved in a highly accurate manner. Thus, the reduction in accuracy of size of the connector fitting portion with respect to the connector which may be caused by forming the holding portion and the outer wall as separate parts and by dividing the outer wall can be prevented.

DETAILED DESCRIPTION OF THE INVENTION

A First Exemplary Embodiment

An electric junction box according to a first embodiment of the present invention will be described below in reference with FIGS. 1-7. An electric junction box 1 according to the present invention arranged to be mounted to an automobile to supply electric power and transmit signal to electric equipments of the automobile.

Figure 1:
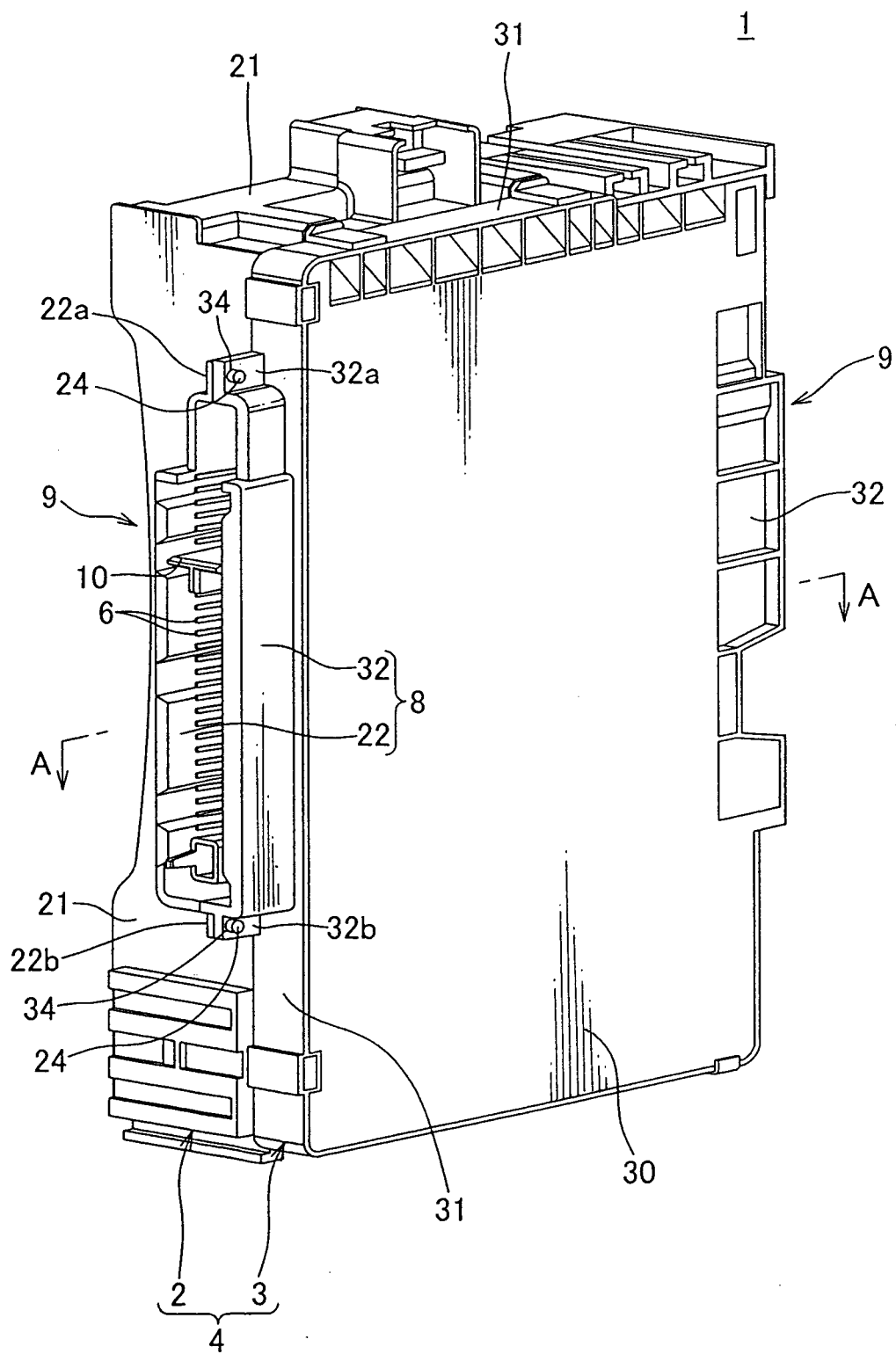
FIG. 1 is a perspective view showing an electric junction box according to a first embodiment of the present invention.
Figure 2:
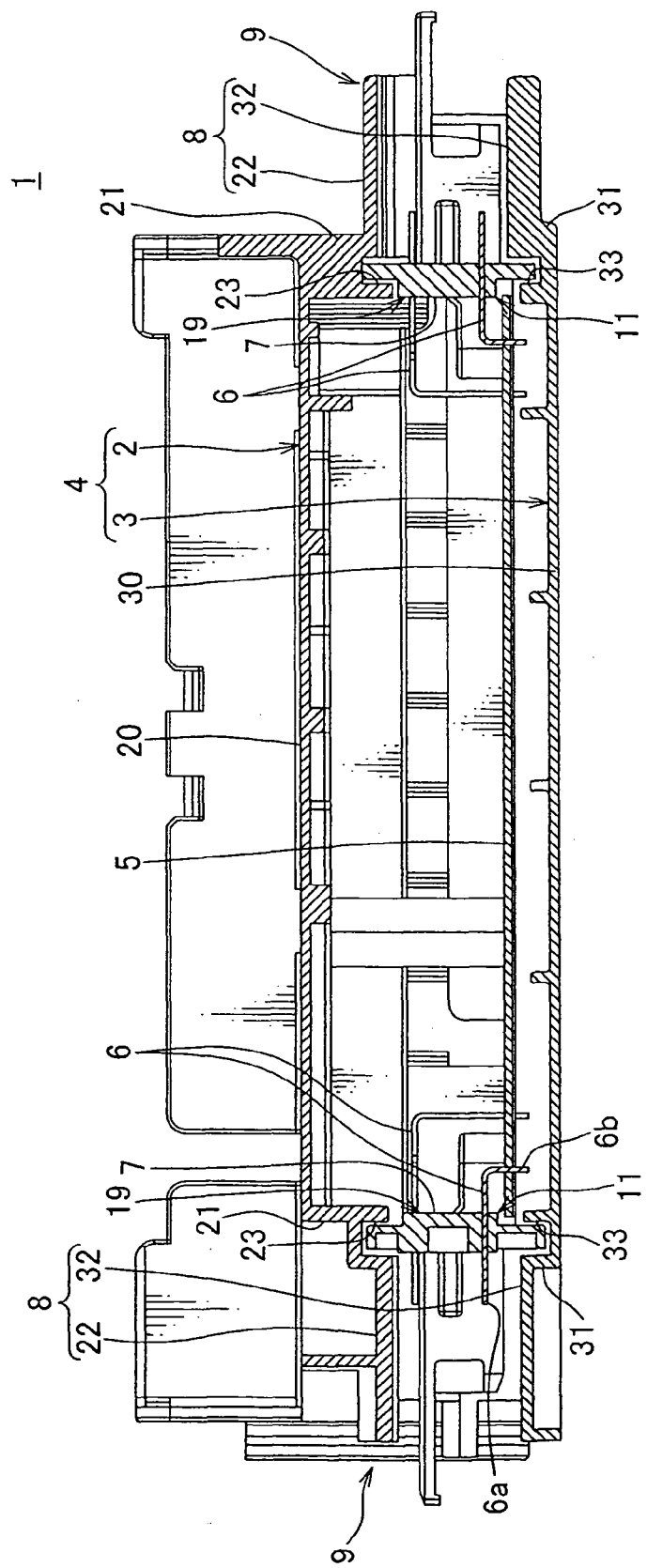
FIG. 2 is a cross-sectional view taken along a line A-A shown in FIG. 1.

As shown in FIG. 1 and FIG. 2, the electric junction box 1 includes a case 4 composed of a box-like body 3 and a box-like body 2 to be assembled together, a substrate 5 received in the case 4, and a pair of connector fitting portions 9 into which a connector 12 of a wire harness 14 fits.

Figure 5:
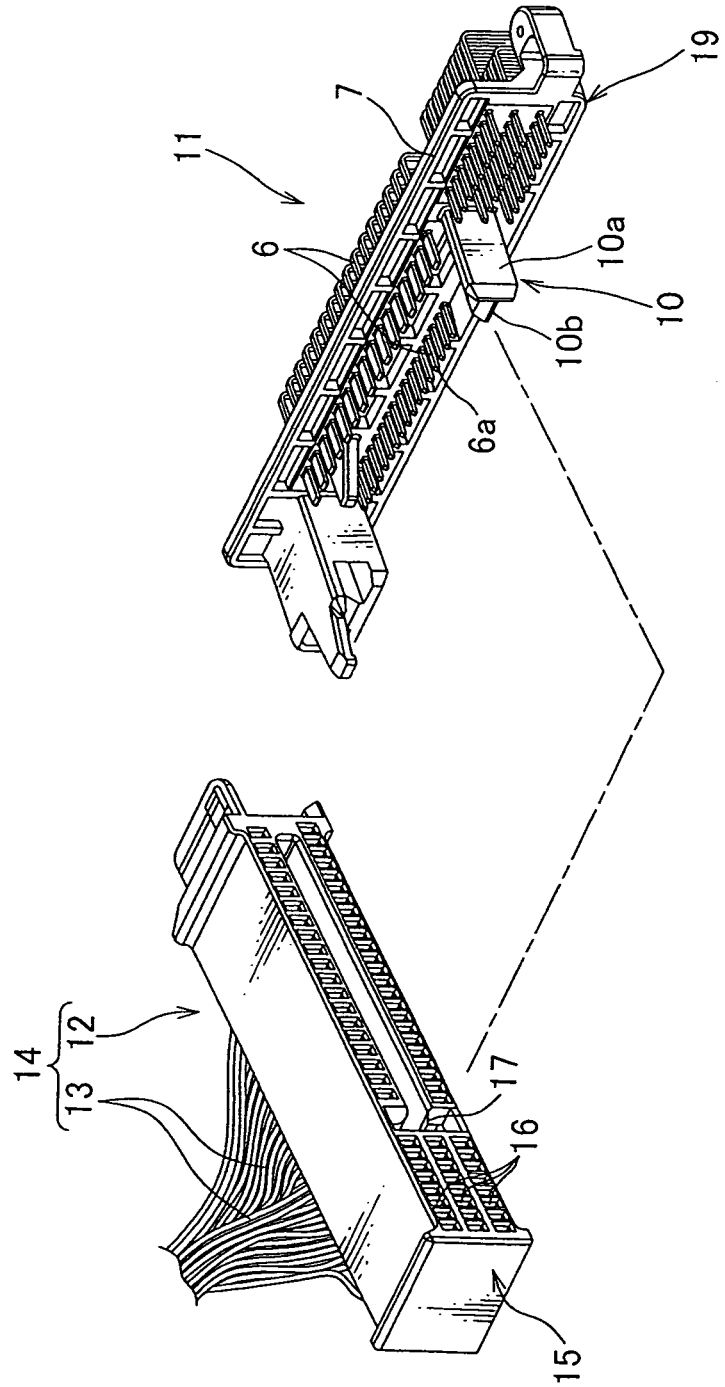
FIG. 5 is a perspective view showing the terminal mounting body shown in FIG. 4 and a connector to be fitted thereto.

As shown in FIG. 5, the above-described wire harness 14 includes a plurality of electric wires 13 and a connector 12 attached to an end of the respective electric wires 13. The connector 12 is provide with a plurality of female-type terminals 16 which are electrically connected with the end of the respective electric wires 13, and a housing 15 receiving the plurality of terminals 16.

The substrate 5 is a printed substrate having a circuit pattern printed on an insulating surface of the substrate 5. Various electric components (not shown) are mounted on the substrate 5. In addition, the substrate 5 is provided with a through hole at which a terminal 6 of the connector fitting portion 9 is connected electrically.

As shown in FIG. 1 and FIG. 2, the connector fitting portion 9 is arranged at both end portions of the substrate 5, respectively, the connector fitting portion 9 being exposed on the outside of the case 4. The respective connector fitting portions 9 is constituted of a terminal mounting body 11 provided with a holding portion 19 holding the plurality of L-shaped male-type terminals 6, the terminals 6 being formed at the holding portion 19 by insert molding or by press fitting; and a tubular outer wall 8 surrounding one end portion 6a of the plurality of terminals 6.

Figure 6:
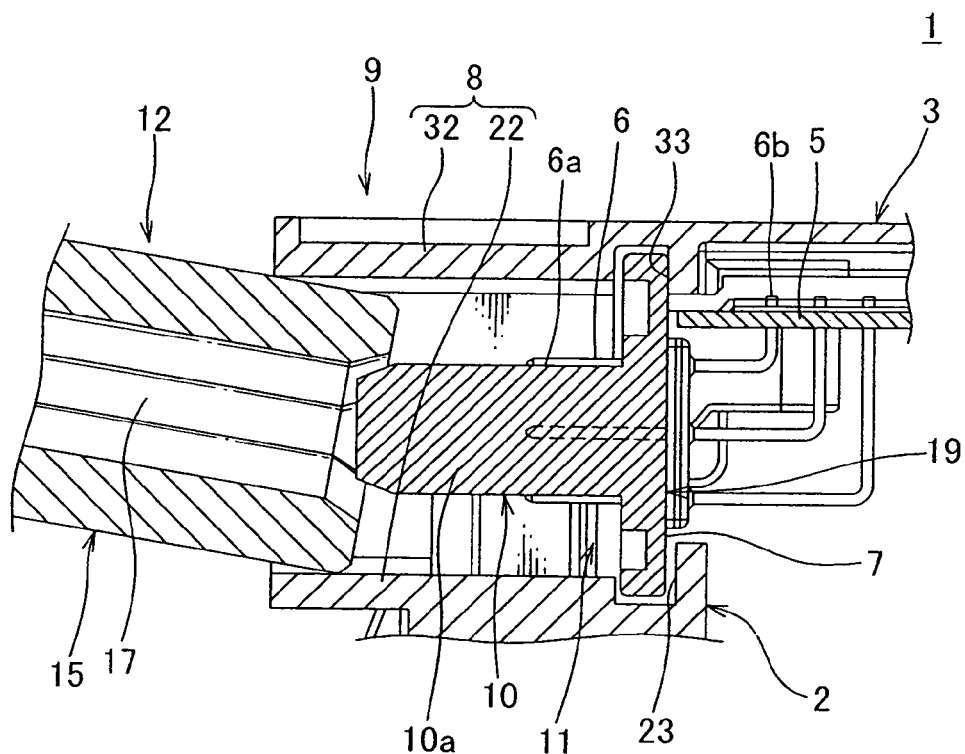
FIG. 6 is a cross-sectional view showing how the connector of FIG. 5 is fitted to the connector fitting portion shown in FIG. 1.
Figure 7:
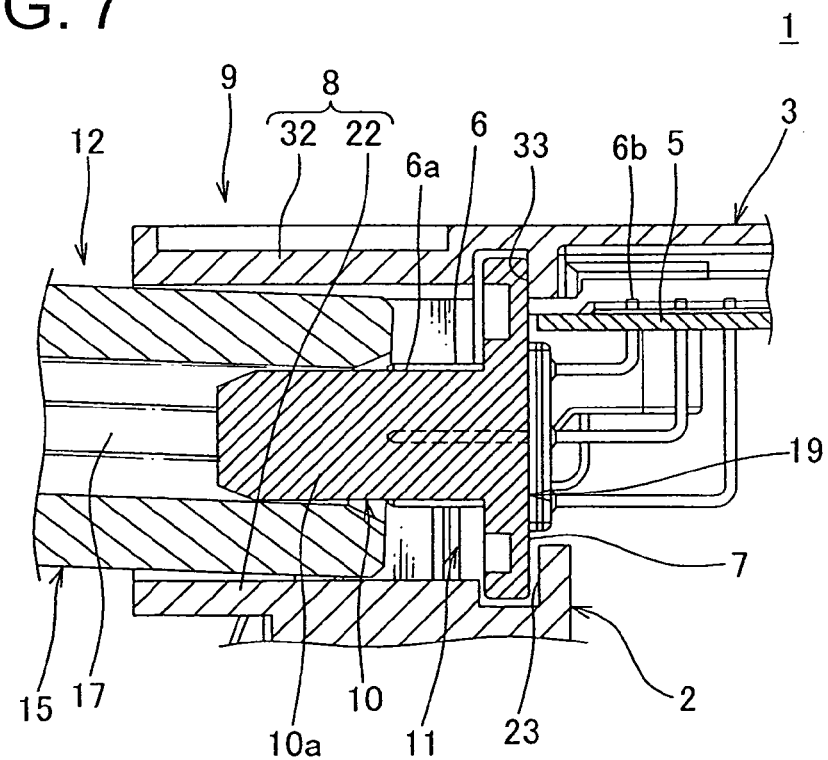
FIG. 7 is a cross-sectional view showing how the connector of FIG. 6 is guided by a guide of the connector fitting portion and fitted to the connector fitting portion.

The holding portion 19 is provide with a back wall 7 formed into a rectangular plate. The back wall 7 is formed integrally with a guide 10 which guides the connector 12 to be fitted to the connector fitting portion 9. The guide 10 includes a plate-like first piece 10a extending perpendicularly from one face of the back wall 7 and a plate-like second piece 10b extending perpendicularly from a side face of the first piece 10a, such that the guide 10 has a T-shaped cross-section. As shown in FIGS. 5-7, this guide 10 is inserted into an aperture 17 of the housing 15 of the connector 12 having a T-shaped cross-section, thereby positioning the connector 12 with respect to the terminal 6.

Since the guide 10 of the present invention is provided with the T-shaped cross-section, the guide 10 can position the terminal 16 of the connector 12 with respect to the terminal 6 of the connector fitting portion 9 in both direction including a fitting direction of the connector 12 and a direction orthogonal to the fitting direction of the connector 12. Consequently, the positioning of the terminal 16 with respect to the terminal 6 can be achieved in a highly accurate manner.

The one end portion 6a of the terminal 6 penetrates through the back wall 7 and projects from the one face of the back wall 7 in parallel with the guide 10. The one end portion 6a is inserted into the female-type terminal 16 of the connector 12 to be electrically connected with the terminal 16. Furthermore, the other end portion 6b of the terminal 6 is soldered to the substrate 5 by reflow soldering using lead-free solder to be electrically connected with the substrate 5.

The above-mentioned "lead-free solder" corresponds to solder containing no lead which is an environmental load substance. In this embodiment, the "lead-free solder" is composed of 3.0 weight percent Ag (silver), 0.5 weight percent Cu (copper) and remaining portion with Sn (tin), and containing no lead. The melting point of this solder is about 220 degrees C.

When soldering the terminal 6 to the substrate 5, in the preliminarily step, the lead-free solder is applied or printed around the through hole of the substrate 5. Then, the other end portion 6b of the terminal 6 is passed through the through hole of the substrate 5, and subsequently the terminal mounting body 11 and the substrate 5 are placed in the reflow soldering oven. The lead-free solder is melted by the heat of the reflow soldering oven and is then hardened, thereby electrically connecting the other end portion 6b of the terminal 6 with the through hole and the circuit pattern of the substrate 5.

In addition, according to the present invention, instead of using the reflow soldering, the flow soldering using the lead-free solder may be used to electrically connect the terminal 6 of the terminal mounting body 11 with the substrate 5. In case of soldering the terminal 6 the substrate 5 using the flow soldering, first the other end portion 6b of the terminal 6 is passed through the through hole of the substrate 5, and then the terminal mounting body 11 and the substrate 5 are placed adjacent to a soldering tank, followed by adhering the melted lead-free solder in the soldering tank to both a back face of the substrate 5 and the other end portion 6b of the terminal 6 projecting from the through hole of the substrate 5. The adhered lead-free solder is then hardened, thereby electrically connecting the other end portion 6b of the terminal 6 with the through hole and the circuit pattern of the substrate 5. Thus, according to the present invention, the term "soldering" may be the reflow soldering or the flow soldering described above, but in either way, the holding portion 19 is exposed to high temperatures.

As described above, for the electric junction box 1 according to the present invention, the terminal 6 of the terminal mounting body 11 is electrically connected with the substrate 5 using the lead-free solder via the reflow soldering or the flow soldering. Therefore, the holding portion 19 of the terminal mounting body 11 is made of heat-resistant resin which does not melt during the reflow soldering or the flow soldering of the terminal 6 and the substrate 5. In other words, the holding portion 19 is made of the heat-resistant resin which does not melt by the heat of the reflow soldering oven or by the heat of the soldering tank.

In addition, since the lead-free solder used in this embodiment has a melting point of about 220 degrees C., the above-mentioned "heat-resistant resin" used in this embodiment should have the melting point higher than 220 degrees C. The heat-resistant resin which is suitable for use in this embodiment may include, SPS with the melting point of about 240-270 degrees C. (for example, "XAREC S131 (the melting point is about 270 degrees C.)" available from Idemitsu Kosan Co., Ltd.), PBT with the melting point of about 230 degrees C., HPA with the melting point of about 330 degrees C., and PA/PPE with the melting point of about 260 degrees C. (for example, "XYRON A0210 (the melting point is about 260 degrees C.)" available from Asahi Kasei Chemicals Corporation).

Figure 3:
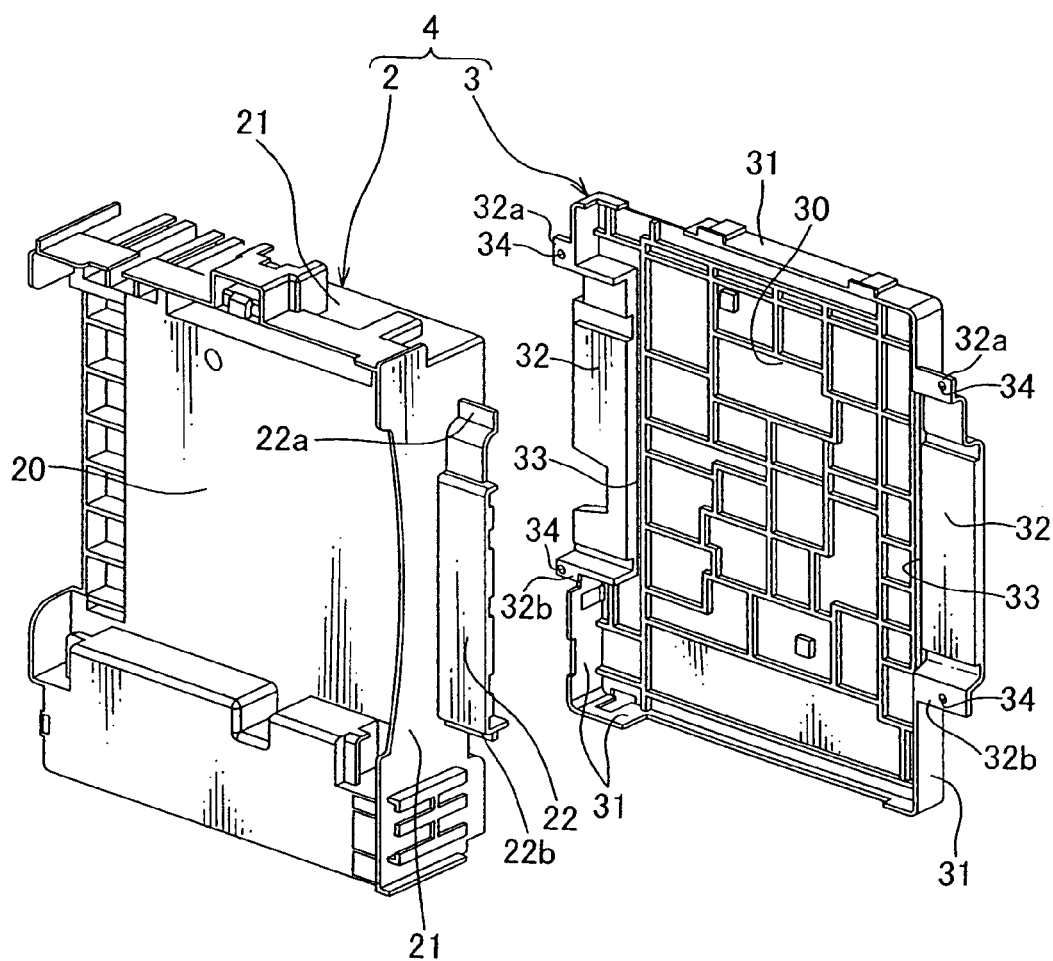
FIG. 3 is a perspective view showing one box-like body and the other box-like body constituting a connector fitting portion of the electric junction box shown in FIG. 1.
Figure 4:
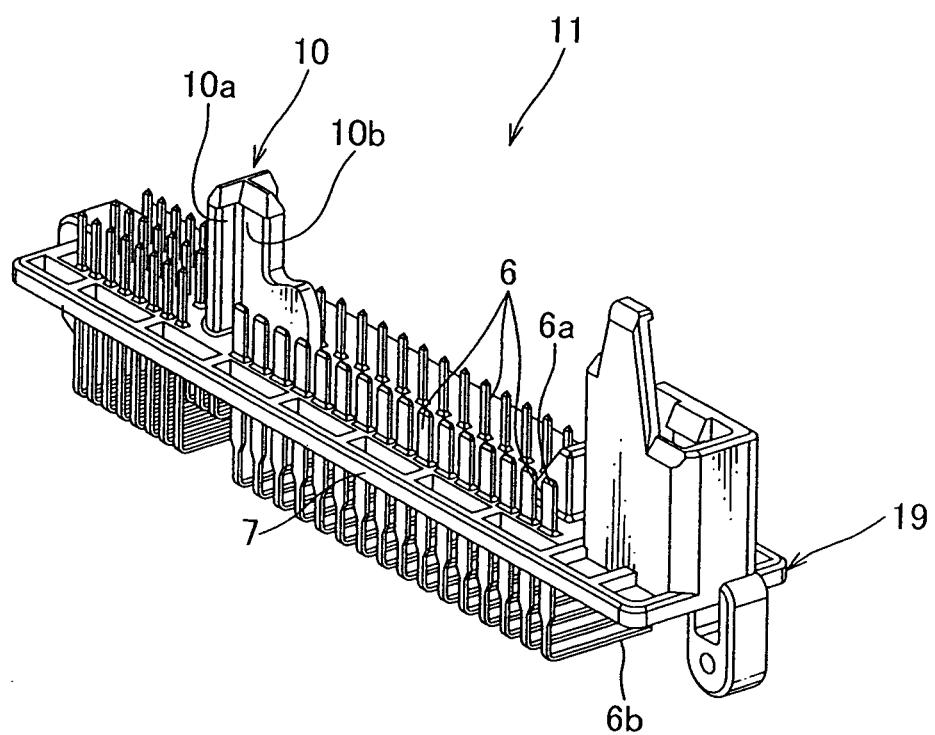
FIG. 4 is a perspective view showing a terminal mounting body of the connector fitting portion of the electric junction box shown in FIG. 1.

The outer wall 8 of the connector fitting portion 9 is arranged so as to surround the one end portion 6a of the plurality of terminals 6 to protect the terminals 6. At a time of fitting the connector 12 to the connector fitting portion 9, the outer wall 8 receives the housing 15 of the connector 12 therein, thereby positioning the connector 12 with respect to the terminal 6. Furthermore, as shown in FIG. 3, the outer wall 8 and the holding portion 19 are formed as separate parts, and the outer wall 8 is constituted of two segments, a segment 32 and a segment 22. In addition, the segment 32 and the segment 22 are formed integrally with the box-like body 3 and the box-like body 2, respectively. When the box-like body 3, the box-like body 2, the substrate 5 and the terminal mounting body 11, the terminal mounting body 11 being soldered to the substrate 5 by the reflow soldering, are assembled together, the outer wall 8 is positioned so as to surround the one end portion 6a of the plurality of terminal 6.

As described above, according to the present invention, since the holding portion 19 and the outer wall 8 are formed as separate parts, and since the outer wall 8 and the terminal mounting body 11 are assembled together after the terminal 6 of the terminal mounting body 11 is soldered to the substrate 5 by the reflow soldering or the flow soldering, there is no need to form the outer wall 8 using expensive heat-resistance resin. Consequently, according to the present invention, the outer wall 8 is made of inexpensive non-heat-resistance which may melt during the reflow soldering or the flow soldering of the terminal 6 and the substrate 5. In other words, the outer wall 8 is made of inexpensive non-heat-resistance resin which melts due to the heat of the above-mentioned reflow soldering over or the soldering tank. Therefore, the cost can be reduced.

Furthermore, since the melting point of the lead-free solder used in this embodiment is about 220 degrees C., the "non-heat-resistant resin" used in this embodiment corresponds to the resin with the melting point of lower than 220 degrees C. The non-heat-resistant resin which is suitable for use in this embodiment may include, for example, PPT with the melting point of about 165 degrees C., PPGT with the melting point of about 165 degrees C., PP with the melting point of about 165 degrees C. and PP/PPE with the melting point about 165 degrees C.

As shown in FIGS. 1-3, the box-like body 3 includes and is integrally formed with a plate-like body wall 30 facing the substrate 5, a plurality of peripheral walls 31 extending perpendicularly from an outer periphery of the body wall 30, and two segments 32 extending in a direction orthogonal to the peripheral wall 31 from an end of the peripheral wall 31 distant from the body wall 30. These two segments 32 are provided at the pair of opposed peripheral walls 31, respectively, the two segments 32 extending in a direction away from each other. The box-like body 3 is made of the non-heat-resistant resin described above.

As shown in FIGS. 1-3, the box-like body 2 includes and is integrally formed with a body wall 20 facing the substrate 5, a plurality of peripheral walls 21 extending perpendicularly from an outer periphery of the body wall 20, and two segments 22 extending in a direction orthogonal to the peripheral wall 21 from an end of the peripheral wall 21 distant from the body wall 20. These two segments 22 are provided at the pair of opposed peripheral walls 21, respectively, the two segments 22 extending in a direction away from each other. The box-like body 2 is made of the non-heat-resistant resin described above.

The box-like body 3 and the box-like body 2 are assembled together such that the substrate 5 and the two terminal mounting bodies 11 are placed between the body wall 30 and the body wall 20. When the box-like body 3 and the box-like body 2 are attached to each other, each of the segments 32 is attached to each of the segments 22, forming the above-described tubular outer wall 8.

Furthermore, as shown in FIGS. 1 and 3, respective end portions 22a, 22b, at both ends of the segment 22 of the outer wall 8 are provided with a cylindrical projection 24 projecting towards the corresponding segment 32 to be assembled together. Also, respective end portions 32a, 32b at both ends of the segment 32 are provided with a through hole 34 into which the projection 24 is inserted. The through hold 34 is formed into a circular-shaped hole so that the projection 24 can pass therethrough. The respective projections 24 are inserted into the respective through holes 34 and bonded with respective through holes 34, thereby fixing the segments 22 and 32 to each other. In this embodiment, the projection 24 and the through hole 34 are bonded to each other by welding.

In addition, according to the present invention, instead of using welding (i.e. melting the components with heat to bond them together), the projection 24 and the through hole 34 can be bonded to each other by using pressure bonding (i.e. components are bonded together by pressing against each other under application of heat) or by using adhesive. Furthermore, in this embodiment, the projection 24 may be press-fitted into the through hole 34, or the projection 24 may be press-fitted into the through hole 34 followed by adhering the projection 24 and the through hole 34 to each other. Furthermore, the through hole 34 may be replaced with a recessed portion (a portion formed concaved from a surface of the component) so as to engage with the projection 24.

As described above, the segments 22, 32 constituting the outer wall 8 are provided with the projection 24 and the through hold 34, respectively. Consequently, the outer wall 8 is prevented from opening, and also accuracy of size of an opening (inner diameter) of the outer wall 8 can be improved. Thus, the reduction in accuracy of size of the connector fitting portion 9 with respect to the connector 12 which may be caused by forming the holding portion 19 and the outer wall 8 as separate parts and by dividing the outer wall 8 into two segments can be prevented.

Furthermore, as shown in FIG. 2, the box-like body 3 is provided with a groove 33 arranged to engage with one end portion of the back wall 7 of the holding portion 19 along the width direction. Similarly, the box-like body 2 is provided with a groove 23 arranged to engage with the other end portion of the back wall 7 of the holding portion 19 along the width direction. Thus, the holding portion 19 is attached to the box-like body 3 and the box-like body 2 so that the back wall 7, i.e. the holding portion 19, is placed between the groove 33 of the box-like body 3 and the groove 23 of the box-like body 2.

As described above, according to the present invention, the holding portion 19, i.e. the terminal mounting body 11, is attached to the box-like body 3 and the box-like body 2 such that the holding portion 19 is sandwiched between the groove 33 of the box-like body 3 and the groove 23 of the box-like body 2. Consequently, there is no need to fix the holding portion 19 and the box-like body 2, 3 using a screw. Thus, the cost can be reduced. Furthermore, the terminal mounting body 11 can be easily positioned with respect to the box-like bodies 3, 2 by fitting the holding portion 19 into the grooves 33, 32. Thus, the assembling of the terminal mounting body 11 and the box-like bodies 3, 2 can be facilitated. Furthermore, it is expected that, by forming the holding portion 19 and the outer wall 8 as separate parts, a load may apply to the back wall 7 of the holding portion 19 when fitting or removing the connector 12 into or from the connector fitting portion 9, causing deformation of the back wall 7 or causing application of an external force to the soldered portion between the substrate 5 and the terminal 6; however, by fitting the one end portion and the other end portion of the back wall 7 into the grooves 33, 23, respectively, the deformation of the back wall 7 can be reduced. Consequently, the soldered portion can be prevented from being subjected to the external force, preventing the cracking of the soldered portion.

The assembling of the electric junction box 1 according to this embodiment is explained below. First, the terminal 6 of the terminal mounting body 11 is soldered to the substrate 5 using the reflow soldering according to the aforementioned procedure. Then, the terminal mounting body 11 and the substrate 5 are positioned at the box-like body 2, followed by assembling the box-like body 2 and the box-like body 3 together.

The connector 12 of the wire harness 14 is fitted to the connector fitting portion 9 of the electrical junction box 1 assembled in a manner described above. When fitting the connector 12 to the connector fitting portion 9, as shown in FIG. 6, first, the housing 15 of the connector 12 is abutted on the inner face of the outer wall 8 so as to be partially positioned. Next, as shown in FIG. 7, the guide 10 is inserted into the aperture 17 of the connector 12, thereby achieving highly-accurate positioning of the terminal 16 of the connector 12 with respect to the terminal 6 of the connector fitting portion 9.

As described above, according to the present invention, there is provided the guide 10 having the T-shaped cross-section extending perpendicularly from the holding portion 19 towards the connector 12. Consequently, the lowering of the accuracy of the size of the connector fitting portion 9 with respect to the connector 12 caused by forming the holding portion 19 and the outer wall 8 as separate parts as well as by dividing the outer wall 8 into two segments can be prevented. Furthermore, since the guide 10 can be provided with a relatively large tapered-portion at a tip end thereof, there is no need to provide the outer wall 8 with the opening (inner diameter) with high accuracy. In addition, according to the present invention, the guide 10 does not need to be provided with the T-shaped cross-section. For example, the guide 10 may have a plate-like shape or a stick-like shape extending perpendicularly from the back wall 7 of the holding portion 19. That is, the guide 10 may be provided only with a first extending portion 10a.

Accordingly, the present invention can provide the electric junction box 1 which can protect the terminal 6, facilitate the positioning of the connector 12 with respect to the connector fitting portion 9, and facilitate the mating of the terminal 16 of the connector 12 with the terminal 6 of the connector fitting portion 9, while at the same time reducing the cost by reducing the use amount of the expensive heat-resistant resin.

A Second Exemplary Embodiment

Referring now to FIGS. 8-12, an electric junction box according to a second embodiment of the present invention is described below. In FIGS. 8-12, the components similar to those of the first embodiment described above are indicated by the same reference signs as the first embodiment, thereby eliminating the detailed explanation.

Figure 8:
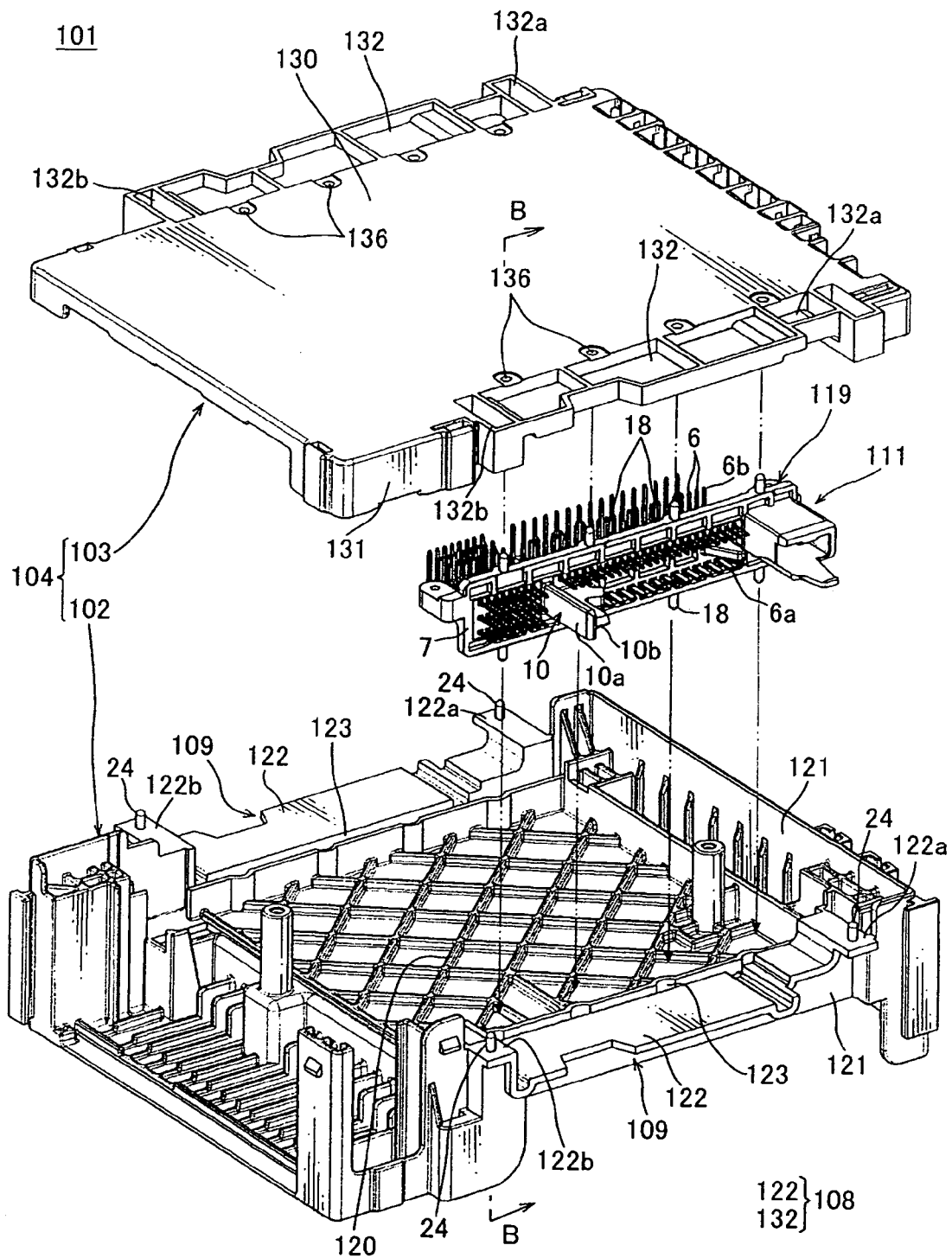
FIG. 8 is a perspective view showing an electric junction box according to a second embodiment of the present invention.
Figure 12:
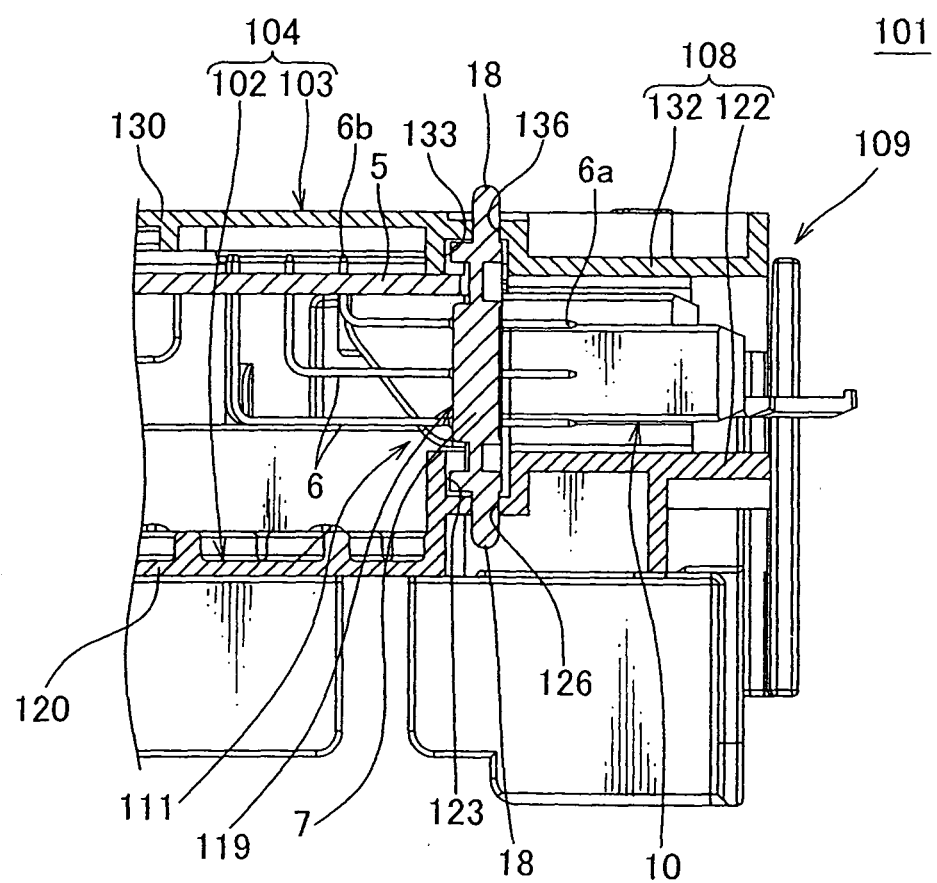
FIG. 12 is a cross-sectional view taken along a B-B line shown in FIG. 8.
Figure 13:
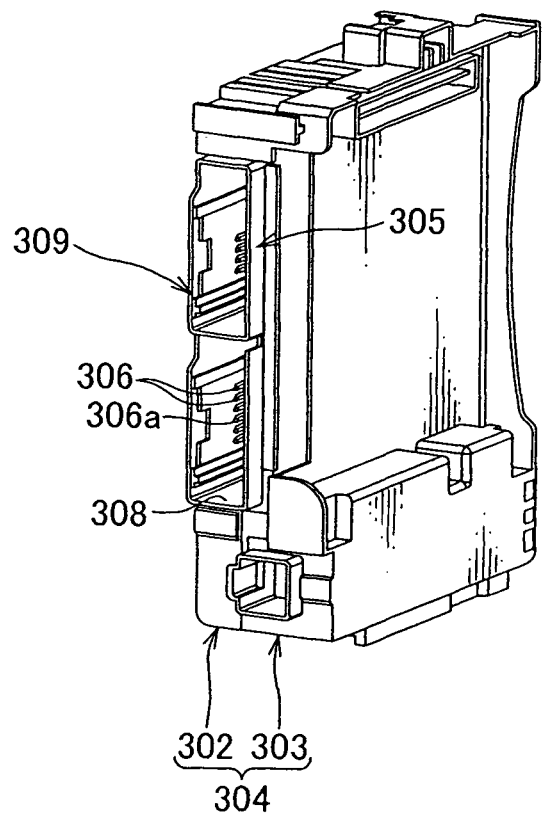
FIG. 13 is a perspective view showing a conventional electric junction box.
Figure 14:
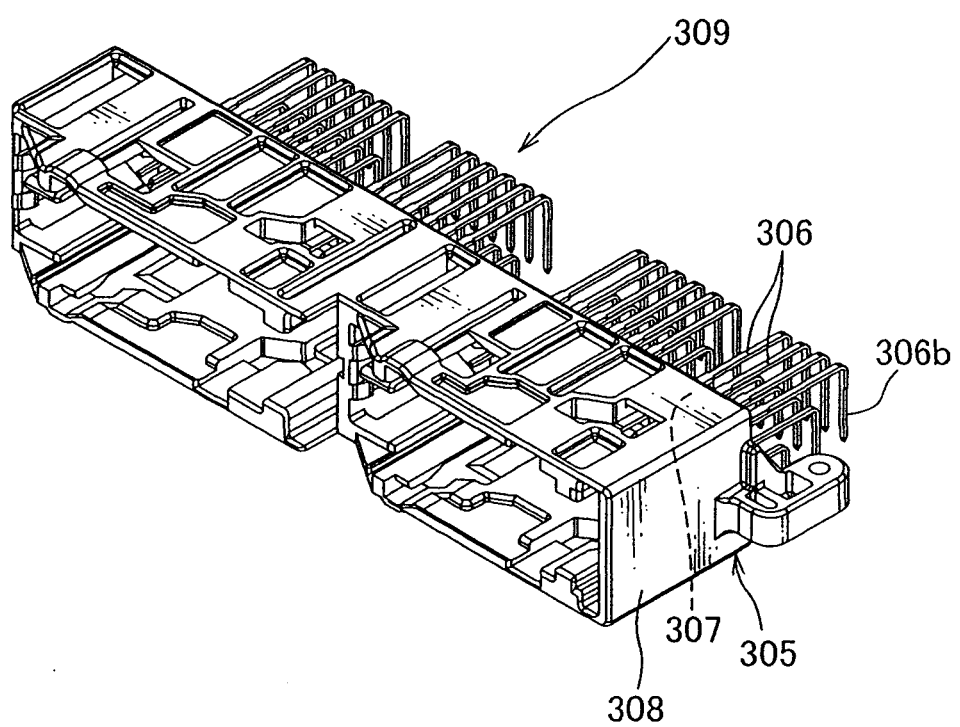
FIG. 14 is a perspective view showing a conventional connector fitting portion of the electric junction box shown in FIG. 13.

As shown in FIG. 8 and FIG. 12, an electric junction box 101 according to this embodiment includes a case 104 composed of a box-like body 103 and a box-like body 102 to be assembled together, a substrate 105 received in the case 104, and a pair of connector fitting portions 109 into which a connector 12 of a wire harness 14 (refer to FIG. 5) fits.

Figure 11:
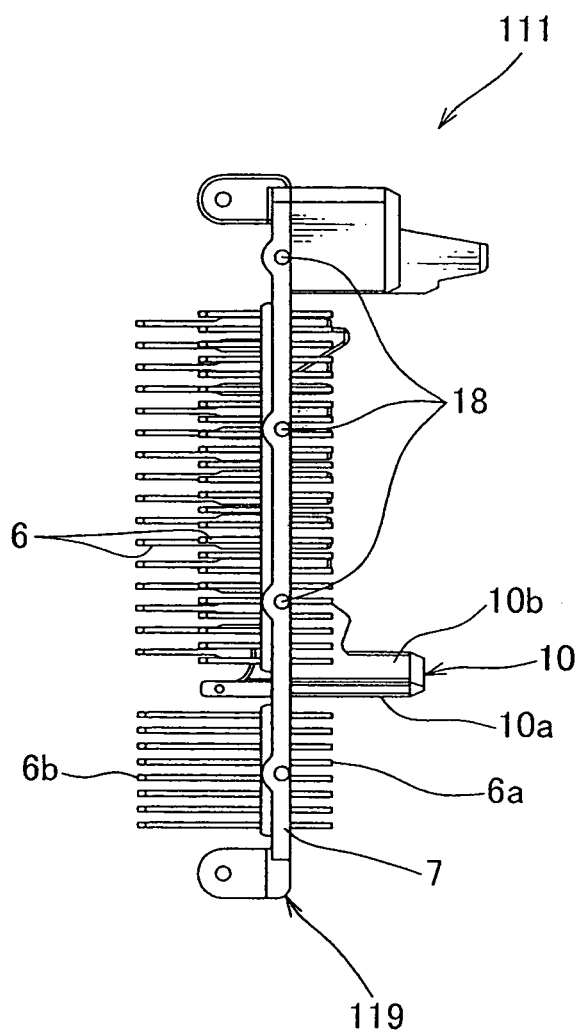
FIG. 11 is a plane view showing a terminal mounting body of a connector fitting portion of the electric junction box shown in FIG. 8.

As shown in FIG. 8 and FIG. 11, the connector fitting portions 109 includes a terminal mounting body 111 provided with a holding portion 119 holding a plurality of L-shaped male-type terminals 6, the terminals 6 being formed at the holding portion 119 by insert molding, and a tubular outer wall 108 surrounding one end portion 6a of the plurality of terminals 6.

The holding portion 119 includes and is integrally formed with a rectangular-plate-shaped back wall 7 and a plurality of cylindrical projections 18 projecting from one end portion and the other end portion of the back wall 7 in the width direction, as shown in FIG. 8. The projection 18 provided at the one end portion of the back wall 7 and the projection 18 provided at the other end portion of the back wall 7 extend in a direction away from each other. Furthermore, the back wall 7 is integrally formed with the aforementioned guide 10. Furthermore, the holding portion 119 is made of the heat-resistant resin which does not melt during the soldering of the terminal 6 and the substrate 5 using the lead-free solder via the reflow soldering or the flow soldering.

The outer wall 108 and the holding portion 119 are formed as separate parts. The outer wall 108 is constituted of two segments, a segment 132 and a segment 122, as shown in FIG. 8. In addition, the segment 132 and the segment 122 are formed integrally with the box-like body 103 and the box-like body 102, respectively. The box-like body 103 and the box-like body 102 are made of the non-heat-resistant resin which is inexpensive and which may melt during the soldering of the terminal 6 and the substrate 5 using the lead-free solder via the reflow soldering or the flow soldering.

Figure 9:
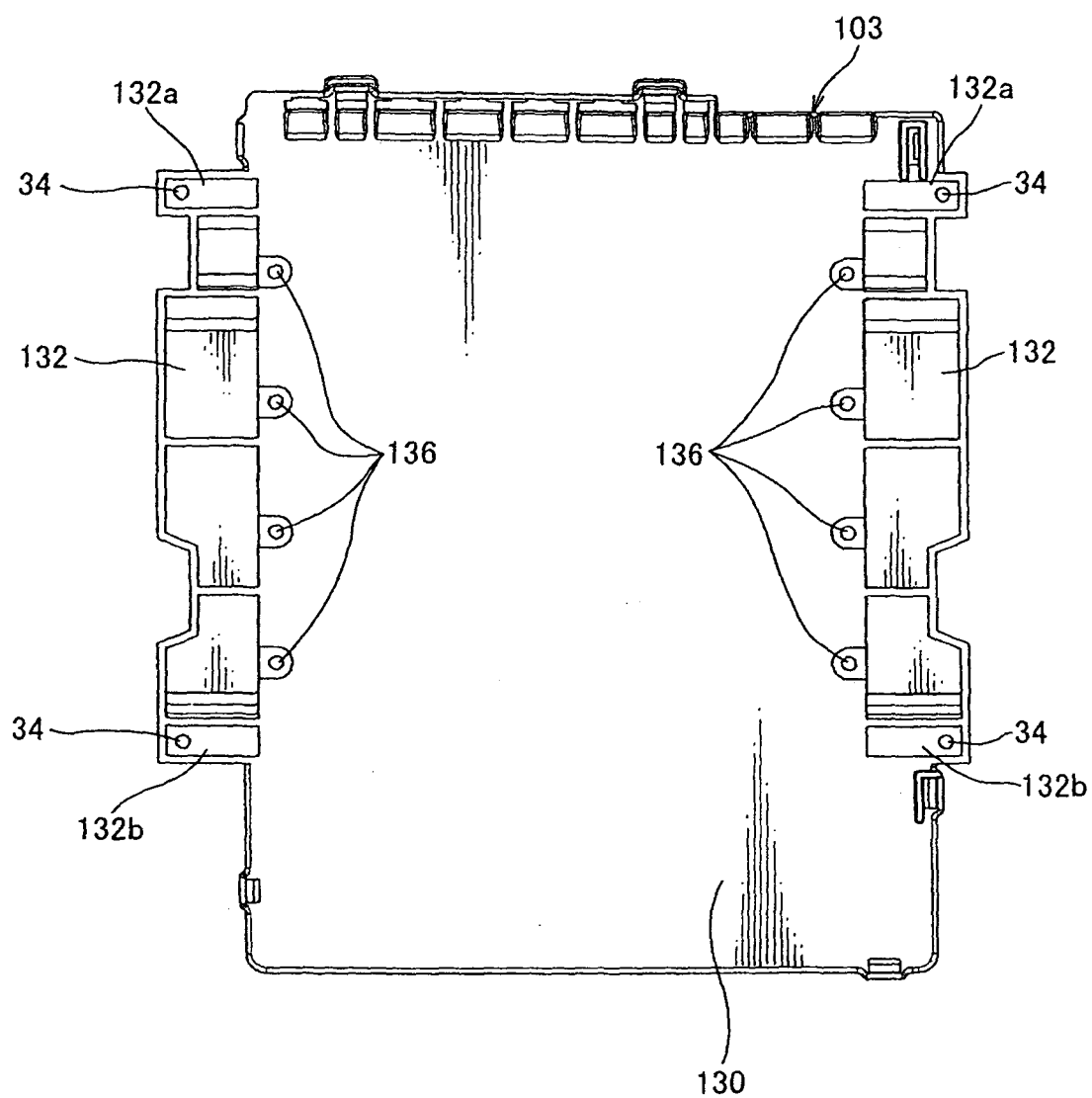
FIG. 9 is a plane view showing one box-like body of a case of the electric junction box shown in FIG. 8.

As show in FIG. 8, FIG. 9 and FIG. 12, the above-described box-like body 103 includes and is formed integrally with a plate-like body wall 130 facing the substrate 10, a plurality of peripheral walls 131 extending perpendicularly from an outer periphery of the body wall 130, and two segments 132 extending from an end of the peripheral wall 131 distance from the body wall 130 in a direction orthogonal to the peripheral wall 131.

Figure 10:
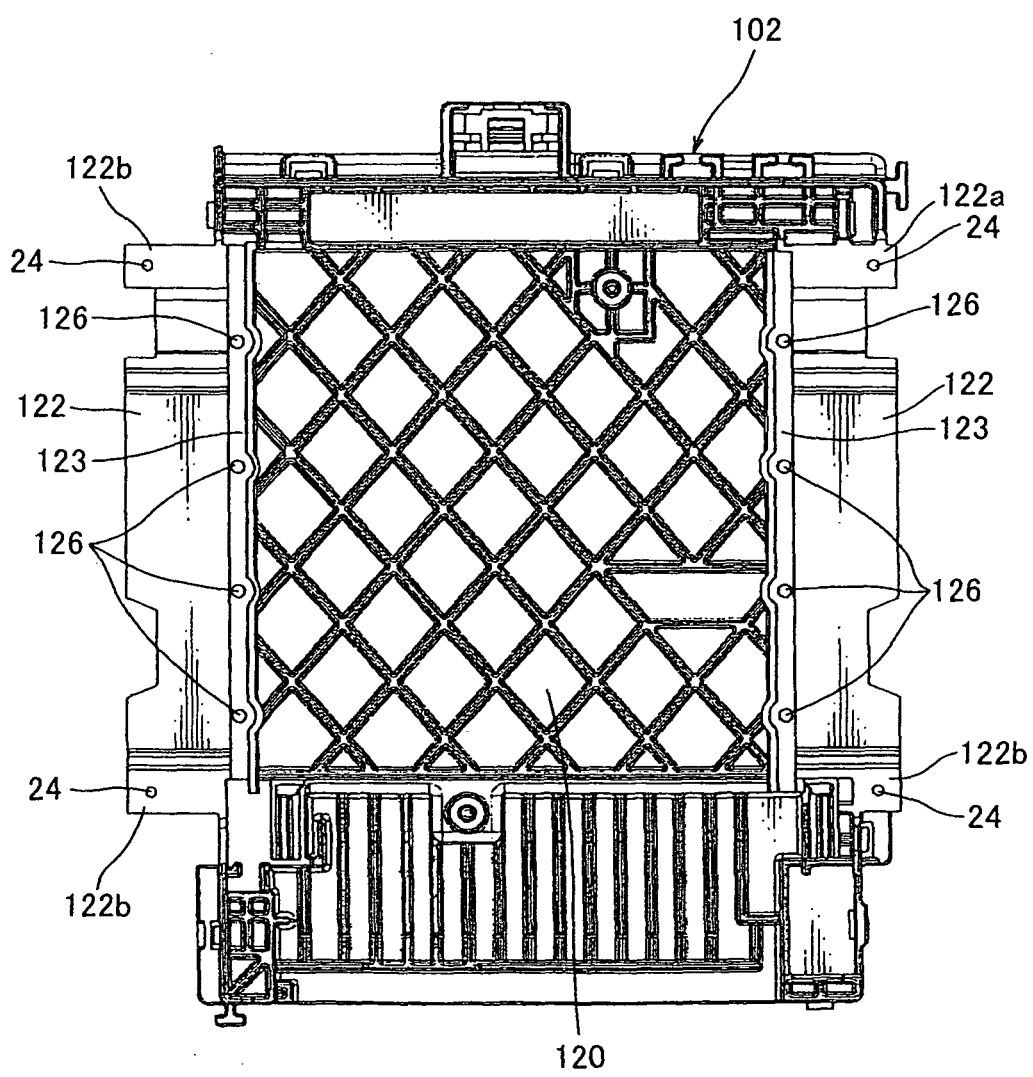
FIG. 10 is a plane view showing the other box-like body of the case of the electric junction box shown in FIG. 8.

As shown in FIG. 8, FIG. 10 and FIG. 12, the above-described box-like body 102 includes and is formed integrally with a plate-like body wall 120 facing the substrate 10, a plurality of peripheral walls 121 extending perpendicularly from an outer periphery of the body wall 120, and two segments 122 extending from an end of the peripheral wall 121 distance from the body wall 120 in a direction orthogonal to the peripheral wall 121.

Furthermore, as shown in FIGS. 8-10, respective end portions 122a, 122b at both ends of the segment 122 of the outer wall 108 are provided with a cylindrical projection 24 projecting upwardly towards the segment 132 to be assembled together. Also, respective end portions 132a, 132b at both ends of the segment 132 are provided with a through hole 34 into which the projection 24 is inserted.

Furthermore, as shown in FIG. 12, the box-like body 103 is provided with a groove 133 into which the one end portion of the back wall 7 of the holding portion 119 in the width direction is fitted. Similarly, the box-like body 102 is provided with a groove 123 to which the other end portion of the back wall 7 of the holding portion 119 in the width direction is fitted. Furthermore, a through hole 136, 126 is provided at a bottom of the groove 133, 123 into which the respective projections 18 projecting from the one end portion and the other end portion of the back wall 7 are inserted. The through hole 136, 126 is formed into a circular hole. Thus, the holding portion 119 is attached to the box-like body 103 and to the box-like body 102, so that the back wall 7, i.e. the holding portion 119, is placed between the groove 133 of the box-like body 103 and the groove 123 of the box-like body 102, while the respective projections 18 are fitted into and bonded with the respective through holes 136, 126. In addition, in this embodiment, the projection 18 and the through hole 136, 126 are bonded by welding.

Furthermore, according to the present invention, instead of using welding (i.e. melting the components by heat to bond them together), the projection 18 and the through hole 136, 126 may be bonded to each other by using pressure bonding (i.e. components are bonded together by being pressed against each other under application of heat) or by using adhesive. Furthermore, according to the present invention, the projection 18 may be press-fitted into the through hole 136, 126, or the projection 18 may be press-fitted into the through hole 136, 126 followed by adhering the projection 18 and the through hole 136, 126 to each other. Furthermore, the through hole 136, 126 may be replaced with a recessed portion (a portion which is formed concaved from a surface of the component) so as to engage with the projection 18.

Furthermore, although the plurality of projections 18 are provided at the one end portion and the other end portion of the back wall 7 of the holding portion 119, according to the present invention, the plurality of projections 18 may be provided at least one of the one end portion and the other end portion of the back wall 7 of the holding portion 119. For example, if the projection 18 is provided only at the one end portion of the back wall 7 in the width direction, the through hole 136 or the above-mentioned recessed portion may be provided only at the box-like body 103.

As described above, according to the present invention, the holding portion 119 is sandwiched between the groove 133 of the box-like body 103 and the groove 123 of the box-like body 102, while the projection 18 is fixed at the through hole 136, 126. In such manner, the holding portion 119, i.e. the terminal mounting body 111, is attached to the box-like body 103 and to the box-like body 102. Consequently, there is no need to fix the holding portion 119 to the box-like body 103, 102 using a screw, reducing the cost.

The embodiments described herein are only representative embodiment of the present invention, and the present invention is not limited thereto. It is understood that various modifications and changes can be made within the scope of the scope of the invention.

What is claimed is:

1. An electric junction box, comprising:
   a case including one box-like body and the other box-like body to be assembled together;
   a substrate received in the case; and
   a connector fitting portion into which a connector fits, the connector fitting portion having a terminal soldered to the substrate using lead-free solder and electrically connected to the substrate, a holding portion holding the terminal, and a tubular outer wall surrounding the terminal;
   wherein
   the holding portion and the outer wall are formed as separate parts,
   the outer wall is divided into two segments, the two segments being formed integrally with the one box-like body and the other box-like body, respectively, and
   the holding portion is made of heat-resistant resin which is resistant to heat used during the soldering, and the outer wall disposed adjacent to a soldering point on the substrate is made of non-heat-resistant resin which melts due to the heat used during the soldering wherein the outer wall and the substrate are separate components.

2. The electric junction box according to claim 1, wherein the holding portion is provided with a projection projecting from at least one of one end portion of the holding portion and the other end portion of the holding portion,
   at least one of the one box-like body and the other box-like body is provided with a recessed portion or a through hole into which the projection is inserted, and
   the holding portion is attached to the case by press-fitting the projection into the recessed portion or into the through hole, or by inserting the projection into the recessed portion or into the through hole followed by bonding the projection to the recessed portion or to the through hole.

3. The electric junction box according to claim 2, wherein one of the two segments of the outer wall is provided with a projection projecting towards the other one of the two segments, while the other one of the two segments is provided with a recessed portion or a through hole, so that the two segments are fixed together by press-fitting the projection of the segment into the recessed portion or the through hole of the segment, or by inserting the projection of the segment into the recessed portion or the through hole of the segment followed by bonding the projection of the segment to the recessed portion or the through hole of the segment.

4. The electric junction box according to claim 3, wherein the one box-like body is provided with a groove arranged to engage with the one end portion of the holding portion,
   the other box-like body is provided with a groove arranged to engage with the other end portion of the holding portion, and
   the holding portion is attached to the case so as to be sandwiched between the groove of the one box-like body and the groove of the other box-like body.

5. The electric junction box according to claim 3, wherein the connector fitting portion is provided with a guide for guiding the connecter to be fitted into the connector fitting portion, the guide extending perpendicularly from the holding portion in a direction of a side of the connector.

6. The electric junction box according to claim 2, wherein the one box-like body is provided with a groove arranged to engage with the one end portion of the holding portion,
   the other box-like body is provided with a groove arranged to engage with the other end portion of the holding portion, and
   the holding portion is attached to the case so as to be sandwiched between the groove of the one box-like body and the groove of the other box-like body.

7. The electric junction box according to claim 6, wherein the connector fitting portion is provided with a guide for guiding the connecter to be fitted into the connector fitting portion, the guide extending perpendicularly from the holding portion in a direction of a side of the connector.

8. The electric junction box according to claim 2, wherein the connector fitting portion is provided with a guide for guiding the connecter to be fitted into the connector fitting portion, the guide extending perpendicularly from the holding portion in a direction of a side of the connector.

9. The electric junction box according to claim 1, wherein one of the two segments of the outer wall is provided with a projection projecting towards the other one of the two segments, while the other one of the two segments is provided with a recessed portion or a through hole, so that the two segments are fixed together by press-fitting the projection of the segment into the recessed portion or the through hole of the segment, or by inserting the projection of the segment into the recessed portion or the through hole of the segment followed by bonding the projection of the segment to the recessed portion or the through hole of the segment.

10. The electric junction box according to claim 9, wherein the one box-like body is provided with a groove arranged to engage with the one end portion of the holding portion,
    the other box-like body is provided with a groove arranged to engage with the other end portion of the holding portion, and
    the holding portion is attached to the case so as to be sandwiched between the groove of the one box-like body and the groove of the other box-like body.

11. The electric junction box according to claim 10, wherein the connector fitting portion is provided with a guide for guiding the connecter to be fitted into the connector fitting portion, the guide extending perpendicularly from the holding portion in a direction of a side of the connector.

12. The electric junction box according to claim 9, wherein the connector fitting portion is provided with a guide for guiding the connecter to be fitted into the connector fitting portion, the guide extending perpendicularly from the holding portion in a direction of a side of the connector.

13. The electric junction box according to claim 1, wherein the one box-like body is provided with a groove arranged to engage with the one end portion of the holding portion,
    the other box-like body is provided with a groove arranged to engage with the other end portion of the holding portion, and
    the holding portion is attached to the case so as to be sandwiched between the groove of the one box-like body and the groove of the other box-like body.

14. The electric junction box according to claim 13, wherein the connector fitting portion is provided with a guide for guiding the connecter to be fitted into the connector fitting portion, the guide extending perpendicularly from the holding portion in a direction of a side of the connector.

15. The electric junction box according to claim 1, wherein the connector fitting portion is provided with a guide for guiding the connecter to be fitted into the connector fitting portion, the guide extending perpendicularly from the holding portion in a direction of a side of the connector.

* * * * *